United States Patent [19]
Stegmüller

[11] Patent Number: 4,761,791
[45] Date of Patent: Aug. 2, 1988

[54] MONOMODE DIODE LASER

[75] Inventor: Bernhard Stegmüller, Augsburg, Fed. Rep. of Germany

[73] Assignee: Siemens Aktiengesellschaft, Berlin and Munich, Fed. Rep. of Germany

[21] Appl. No.: 785,228

[22] Filed: Oct. 7, 1985

[30] Foreign Application Priority Data

Oct. 10, 1984 [DE] Fed. Rep. of Germany ....... 3437209

[51] Int. Cl.$^4$ .............................................. H01S 3/19
[52] U.S. Cl. ......................................... 372/46; 372/96
[58] Field of Search ....................... 372/96, 46, 50, 29, 372/32

[56] References Cited

U.S. PATENT DOCUMENTS 4,352,187  9/1982  Amann ................................. 372/46

FOREIGN PATENT DOCUMENTS 59-126693  7/1984  Japan .

OTHER PUBLICATIONS

Kazarinov et al., "Injection Heterojunction Laser with a Diffraction Grating on its Contact Surface", *Soviet Physics–Semiconductors*, vol. 6, No. 7, Jan. 1973, pp. 1184–1189.

Westbrook et al., *Electronics Letters*, vol. 20, No. 6, Mar. 15, 1984, "Continuous-Wave Operation of 1.5 m Distributed-Feedback Ridge-Waveguide Lasers", pp. 225–226.

*Primary Examiner*—James W. Davie
*Attorney, Agent, or Firm*—Hill, Van Santen, Steadman & Simpson

[57] ABSTRACT

A metal-clad ridge waveguide laser diode and method has a grating or discontinuity structure formed laterally of the ridge and possibly over the ridge along the laser active region. The discontinuity structure is formed subsequent to the epitaxial formation of the heterostructure and the ridge.

15 Claims, 1 Drawing Sheet

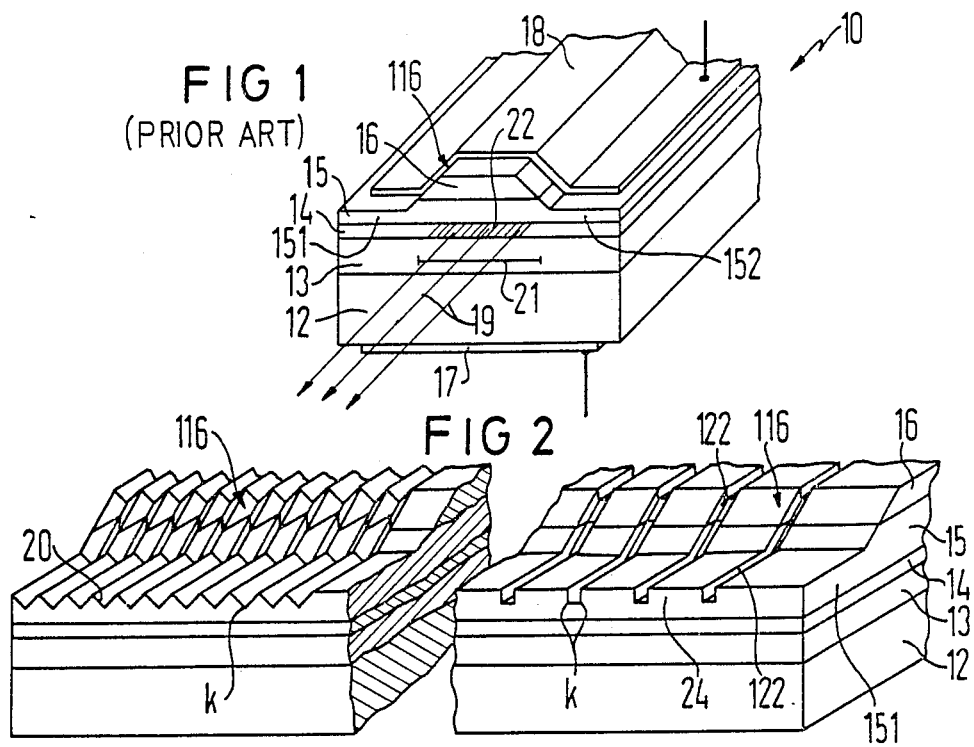
FIG 1 (PRIOR ART)
FIG 2
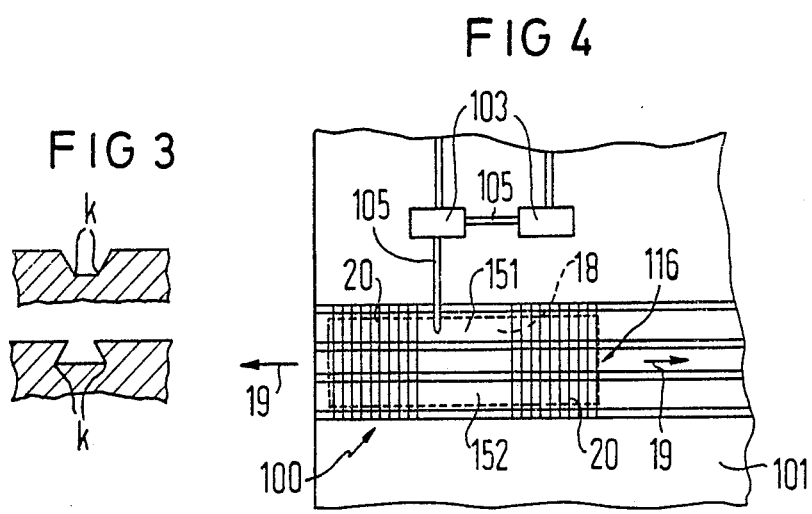
FIG 3
FIG 4

MONOMODE DIODE LASER

BACKGROUND OF THE INVENTION

1. Field of the Invention

The present invention relates generally to a diode laser and, more specifically, to a strip-shaped semiconductor laser diode having a discontinuity structure, such as a grating for monomode-stabilization.

2. Description of the Prior Art

Laser diodes having a double hetero-structure are known. For instance, Amann U.S. Pat. No. 4,352,187 discloses a semiconductor laser diode having an electrode on a strip-shaped highly doped layer overlying a lesser doped layer. A metal clad ridge waveguide is thus formed wherein the highly doped layer forms a low resistance junction to restrict the current path to a strip-shaped area thereby forming a strip-shaped laser-active zone.

To obtain improved monomode, or single mode, laser radiation, numerous proposals have been made for laser diodes. One approach is to provide a plurality of coupled laser-active zones disposed parallel to one another in a laser diode. A second approach is to provide a so-called "grating" within the double hetero-layer structure at the laser active zone. A grating is a geometrical structure with discontinuities arranged transversely relative to the direction of the laser radiation. The discontinuities are distributed periodically, at least to a certain degree, in a longitudinal direction of the laser radiation to provide periodic variation of the refractive index and thus effect the laser radiation. The use of gratings is disclosed in 9 IEEE Journal of Quantum Electronics No. 9, pages 919–933 (September 1973) and 11 IEEE Journal of Quantum Electronics No. 11, pages 867–873 (November 1975).

The manufacturing of such a grating within the double hetero-layer structure, and particularly within the resonant zone, means that an interruption must occur in the epitaxial manufacturing methods of the double hetero-layer device. After the deposition of the first layers of the double hetero-layer structure on a substrate, the epitaxial deposition must be interrupted, the grating produced, and only then can deposition of the further layers be continued. During such interruption, the substrate body of the device must be removed from the epitaxy apparatus. There are numerous disadvantages in such a procedure which relate to the quality of the double hetero-layer structure formed thereby and to the considerable additional technological outlay associated with continuing the layer formation.

It would therefore be an advantage over the devices of the prior art to form a grating or discontinuity structure in a hetero-layer structure laser diode in a simple, uninterrupted manufacturing process.

SUMMARY OF THE INVENTION

It is an object of the present invention to provide a means for achieving improved monomode operation in a laser diode which is relatively free of technological problems.

This and other objects are achieved in a strip geometry laser diode having a double heterostructure and distributed feedback in the form of discontinuities being provided along the laser active region thereof.

Strip geometry lasers having a metal clad ridge waveguide with lateral regions extending on either side thereof can have the single mode operation thereof improved by the provision of a grating-type structure. This grating-structure can be formed in a single step during the manufacture of the double hetero-structure diode. The grating-type structure, or discontinuity structure, may be formed in the lateral regions of the diode and/or in the region of the ridge formed between the lateral regions. The discontinuity, which is outside the resonator zone, can be executed in accordance with the principles of a distributed feedback (DFB) structure or according to the principles of a distributed Bragg reflector (DBR) structure, or the like. The discontinuity structures are arranged distributed over a significant portion of the length of the ridge or, respectively, of the length of the lateral regions, with a sufficient frequency to provide the desired effect. The individual discontinuities extend at right angles to the longitudinal direction of the diode ridge and have a dimension in the longitudinal direction of between one-half and up to three wavelengths of the respective laser radiation wavelengths for the semiconductor material used in the diode. The spacing of the individual discontinuities from one another is likewise matched to the wavelengths of the laser radiation. An uninterrupted discontinuity structure having individual discontinuities spaced regularly one from another can be provided. However, it is sufficient to provide periodic sequences of discontinuities only in sections of the diode and to leave intervals between such discontinuity sections wherein the intervals are very long in comparison to the laser radiation wavelength (for example being greater than 100 wavelengths). The number of discontinuities to be provided; their distribution over the length of the diode; whether they are distributed on the lateral regions and/or on the ridge, and particularly on the edges of the ridge; the depth of the discontinuities; and their proximity to the resonator zone are to be selected so that the discontinuity structures exert a monomode-stabilizing effect on the generated laser radiation.

DESCRIPTION OF THE DRAWINGS

FIG. 1 is a perspective view of a prior art strip-geometry laser.

FIG. 2 is a pair of perspective views of two embodiments of a laser diode according to the principles of the present invention.

FIG. 3 is a pair of cross sections of two embodiments of individual discontinuities according to the principles of the present invention.

FIG. 4 is a plan view of a laser diode similar to that of FIG. 2 formed on a wafer with other components.

DESCRIPTION OF THE PREFERRED EMBODIMENTS

FIG. 1 shows a laser diode 10 of the prior art including a substrate body 12, layers 13, 14, 15 and 16 of the double heterostructure, a first electrode 17, a second electrode 18, and lateral regions 151 and 152. A ridge 116 is formed by removal of portions of the layer 16 and the adjacent layer 15 such as by etching. A resonator zone 22 from which the laser radiation 19 emerges extends in the longitudinal direction of the ridge 116. The resonator zone 22 forms a strip below the ridge 116 that essentially lies in the double heterostructure layer 14, thereby forming a strip-geometry laser.

The width of a current flux region for the diode 10 is indicated at 21. Current flux between the electrodes 17 and 18 is essentially limited to the width of the resonator zone 22 as a consequence of the aforementioned lateral regions 151 and 152 since the layer 15 forms a high impedance boundary with the electrode 18 while the layer 16 forms a low impedance boundary. The lateral regions 151 and 152 extend laterally adjacent the ridge 116 and the strip-shaped resonator zone 22. The lateral regions act as an index guide for the resonator zone 22 on the radiation generated and transmitted in the laser diode such that the laser radiation 19 emerges in a straight line.

The electrode 18 need not extend over the entire length of a resonator zone 22, for example, in the laser diode shown in FIG. 1, the electrode 18 does not extend to the front edge of the diode 10. When a "quantum well" structure is formed by doping the sub-region between the end face of the diode 10 and the edge of the electrode 18 there will be no significant absorption or attenuation of the generated laser radiation in this sub-region of the resonator zone 22.

FIG. 2 shows the substrate 12 and the layer arrangement of the layers 13–16 of the double heterostructure and the electrodes 17 and 18. Discontinuity structures are shown provided in sections as can be used in the present invention. The geometrical shape of the particular discontinuity structure used essentially depends upon what can be most simply manufactured subsequent to the one step method of manufacturing the laser diode 10 and which isn't detrimental to the existing laser diode. For example, etching has been found to be effective.

A washboard structure is shown at 20 on the left portion of FIG. 2, while the right hand portion of FIG. 2 shows a trapezoidal structure 24, which can, for example, be of a rectangular shape. The washboard or corrogated structure 20 can extend to a greater or lesser extent over the length of the diode 10 and can be situated either on the lateral strips 151 and 152 and/or on the ridge 116 and preferably also on the flanks of the ridge 116. A discontinuity structure, such as the discontinuity structure 20, can however be located instead in distributed sections, such as for example in multiple groups of discontinuities 20 arranged spaced from one another.

It has been found that too low a number of the total discontinuities has little effect on the single mode stabilizing effect, while including a greater number of discontinuities beyond that found to be effective has no significant improvement on the single mode performance achieved. For the washboard structure 20, the spacing between the peaks is to coincide with the laser radiation wavelength. Spacings of between a half wavelength and for example, up to three wavelengths can be included. For the trapezoidal structure 24 shown in the right hand portion of FIG. 2, it is the width of the individual incisions 122 which is of critical dimension and should be between a half of a wavelength and up to three wavelengths of the laser signal. However, the center to center spacings of the individual trapezoidal discontinuities 122 can be larger than those of the washboard structure 20, so long as the intervals between the discontinuities 122 are matched to the wavelength of the laser radiation. The structure 24 can also be arranged in distributed sections of discontinuities, just as that described for the structure 20 above. However, a discontinuity structure 24 with larger intervals between the individual discontinuities 122 is diluted with respect to the effect of those discontinuities 122, and the single mode stabilizing effect is thus dependent upon the total number of discontinuities 122 in the diode. In the structures 20 and 24 shown in FIG. 2 the electrode 18 has been omitted for reasons of clarity.

FIG. 3 shows possible cross-sectional shapes of trapezoidal discontinuities. Each has an essentially planar base so that respective edges K thereof are spaced somewhat from one another but the spacing of the edge K is relatively narrow to provide the required periodic variation. The discontinuities 122 can also have a triangular shape as in the case of the structure 20 wherein only one edge K exists. Whether a discontinuity structure can be produced more easily having a triangular cross-section 20 or a trapezoidal cross-section 24 depends upon the selection of the crystal direction and/or on the specific etching agent used.

A plan view of a laser diode 100 of the present invention is shown in FIG. 4 on a wafer 101 which also has additional optical and/or electronic elements 103 integrally formed thereon. The lateral strips 151 and 152 are etched on the diode 100 so that the ridge 116 remains between them. An embodiment having sectional arrangement of discontinuity structures, such as for example the washboard structures 20, is shown in FIG. 4. The discontinuities are preferably distributed over essentially the entire length of the laser diode 100 for the formation of a DFB laser embodiment. For DBR laser embodiments, the discontinuity structures are preferably situated at the respective ends of the laser diode 100 at portions thereof extending beyond the ends of the electrode 18. Discontinuity structures as provided by the present invention also effect the function of resonator reflectors.

In FIG. 4, the electrode 18 is shown in broken lines. The laser diode 100 is shown as a component of a monolithically integrated system on the wafer 101, including the optical and/or electronic components 103. The optical and/or electrical components 103 are connected to one another and to the laser diode 100 by waveguides and/or interconnects 105, which are likewise integrated.

The present invention also provides a method for manufacturing a laser diode having a monomode stabilizing structure on or in a double hetero-layer structure. The epitaxy of the double heterostructure occurs in a single step. The etching of the ridge 116 and of the respective discontinuity structures 20 or 24 follows and, finally, the electrode 18 is applied.

It is apparent from the foregoing specification, that the invention is susceptible to being embodied with various alterations and modifications which may differ particularly from those that I have described in the preceding specification and description. It should be understood that I wish to embody within the scope of the patent granted hereon all such modifications as reasonably and properly come within the scope of my contribution to the art.

I claim as my invention:

1. A laser diode having a double heterostructure on a substrate body and a strip-shaped ridge over a laser active zone including lateral regions extending adjacent thereto and forming a strip-shaped wave guide, first and second electrodes through which current is supplied to the laser diode, an improved discontinuity structure provided for the laser active zone of the laser diode for single mode stabilization, the improvement comprising:
   at least one discontinuity structure formed on at least a portion of a surface of said lateral regions of said double heterostructure, said at least one discontinuity structure being formed only on a surface of said lateral regions; and said heterostructure of said ridge and said lateral regions being formed in a single step.

2. A laser diode as claimed in claim 1 wherein a plurality of said discontinuity structures are distributed sectionally.

3. A laser diode as claimed in claim 1 further comprising:
said first electrode covering a portion of said ridge and a portion of said lateral regions;
a resonator zone in said laser diode, at least one end of said first electrode being spaced from at least one end of said resonator zone;
one of said discontinuity structures being between said first electrode end and said at least one resonator zone end.

4. A laser diode as claimed in claim 1, wherein at least one of said discontinuity structures is a washboard structure.

5. A laser diode as claimed in claim 1, wherein at least one of said discontinuity structures includes trapezoidal shaped discontinuities.

6. A laser diode as claimed in claim 1, further comprising a wafer on which said laser diode is mounted.

7. A laser diode as claimed in claim 1, further comprising:
a wafer on which said laser diode is monolithically integrated; and
a plurality of components integrally formed on said wafer.

8. A laser diode having a double heterostructure on a substrate body and a strip-shaped ridge over a laser active zone including lateral regions extending on either side thereof and forming a strip-shaped wave guide, first and second electrodes through which current is supplied to the laser diode, an improved discontinuity structure provided for the laser active zone for single mode stabilization, the improvement comprising:
at least one discontinuity structure formed on at least a portion of a surface of said strip-shaped ridge and said lateral regions; and said heterostructure of said ridge and of said lateral regions being formed in a single step.

9. A laser diode as claimed in claim 8 wherein said discontinuity structure is formed at least on the surface of the flanks of said ridge.

10. A laser diode as claimed in claim 8 wherein a plurality of said discontinuity structures are distributed sectionally.

11. A laser diode as claimed in claim 8, further comprising: said first electrode covering a portion of said ridge and a portion of said lateral regions;
a resonator zone in said laser diode, at least one end of said first electrode being spaced from at leat one end of said resonator zone; one of said discontinuity structures being between said first electrode end and said at least one resonator zone end.

12. A laser diode as claimed in claim 8, wherein: at least one of said discontinuity structures is a washboard structure.

13. A laser diode as claimed in claim 8, wherein: at least one of said discontinuity structures includes trapezoidal shaped discontinuities.

14. A laser diode as claimed in claim 8, further comprising: a wafer on which said laser diode is mounted.

15. A laser diode as claimed in claim 8, further comprising: a wafer on which said laser diode is monolithically integrated; and
a plurality of components integrally formed on said wafer.

* * * * *